(12) United States Patent
Sandhu et al.

(10) Patent No.: US 8,514,626 B2
(45) Date of Patent: Aug. 20, 2013

(54) MEMORY CELLS AND METHODS OF STORING INFORMATION

(75) Inventors: Gurtej S. Sandhu, Boise, ID (US); D.V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 135 days.

(21) Appl. No.: 13/190,821

(22) Filed: Jul. 26, 2011

(65) Prior Publication Data

US 2013/0028016 A1      Jan. 31, 2013

(51) Int. Cl.
*G11C 16/04*      (2006.01)

(52) U.S. Cl.
USPC ............ 365/185.18; 365/185.26; 365/185.27

(58) Field of Classification Search
USPC ................ 365/184, 185.26, 185.27, 185.18
See application file for complete search history.

(56) References Cited

U.S. PATENT DOCUMENTS

| | | | |
|---|---|---|---|
| 6,049,105 A | 4/2000 | Krautschneider et al. | |
| 6,956,278 B2 * | 10/2005 | Herner | 257/530 |
| 7,145,807 B2 * | 12/2006 | Deppe et al. | 365/185.28 |
| 7,485,513 B2 | 2/2009 | Bhattacharyya | |
| 7,564,718 B2 * | 7/2009 | Seidel et al. | 365/185.28 |
| 7,583,530 B2 * | 9/2009 | Thomas | 365/185.05 |
| 7,608,898 B2 | 10/2009 | Burnett et al. | |
| 7,751,215 B2 | 7/2010 | Kitabatake | |
| 7,863,611 B2 | 1/2011 | Abe et al. | |
| 2008/0237687 A1 | 10/2008 | Kim et al. | |
| 2010/0096680 A1 | 4/2010 | Mouli et al. | |
| 2010/0123130 A1 | 5/2010 | Akimoto et al. | |
| 2010/0320459 A1 | 12/2010 | Umeda et al. | |

FOREIGN PATENT DOCUMENTS

WO  PCT/US2012/044483      1/2013

OTHER PUBLICATIONS

Hosono, "High performance thin-film transistor (TFT) with amorphous InGaZnO4 semiconductor", Retrieved May 5, 2011 from www.jst.go.jp/tt/EN/cips_details/pdf/2-8.pdf.
Kamiya et al., "Present status of amorphous In-Ga-Zn-O thin film transistors", Science and Technology of Advanced Materials, IOP Publishing, 2010, pp. 1-23.
Lorenz et al., "Low-temperature processed Schottky-gated field-effect transistors based on amorphous gallium-Indium-zinc-oxide thin films", Applied Physics Letters, 97, pp. 243506-1 to 243506-3.
Nozawa, "[IEDM] Samsung, Hitachi Announce IGZO-based TFTs", Dec. 17, 2008. Retrieved May 5, 2011 from http://techon.nikkeibp.co.jp/english/NEWS_EN/20081217/162950/.

(Continued)

*Primary Examiner* — Pho M Luu
(74) *Attorney, Agent, or Firm* — Wells St. John, P.S.

(57) ABSTRACT

Memory cells may have channel-supporting material, dielectric material over the channel-supporting material, carrier-trapping material over the dielectric material and an electrically conductive electrode material over and directly against the carrier-trapping material; where the carrier-trapping material includes gallium, indium, zinc and oxygen. A memory cell may be provided which has a channel-supporting material, a dielectric material over the channel-supporting material, a carrier-trapping material over the dielectric material, and an electrically conductive electrode material over and directly against the carrier-trapping material; where the carrier-trapping material includes gallium, indium, zinc and oxygen. It may be determined if carriers are trapped in the carrier-trapping material to thereby ascertain a memory state of the memory cell.

20 Claims, 4 Drawing Sheets

(56) References Cited

OTHER PUBLICATIONS

Hosono, "High performance thin-film transistor (TFT) with amorphous InGaZnO4 semiconductor", Retrieved May 5, 2011 from www.jst.go.jp/tt/EN/cips_details/pdf/2-8.pdf, May 5, 2011.

Kamiya et al., "Present status of amorphous In—Ga—Zn—O thin film transistors", Science and Technology of Advanced Materials, IOP Publishing, 2010, pp. 1-23, Apr. 28, 2010.

Lorenz et al., "Low-temperature processed Schottky-gated field-effect transistors based on amorphous gallium-Indium-zinc-oxide thin films", Applied Physics Letters, 97, pp. 243506-1 to 243506-3, Dec. 23, 2010.

Nozawa, "[IEDM] Samsung, Hitachi Announce IGZO-based TFTs", Dec. 17, 2008. Retrieved May 5, 2011 from http://techon.nikkeibp.co.jp/english/NEWS_EN/20081217/162950/, Dec. 17, 2008.

* cited by examiner

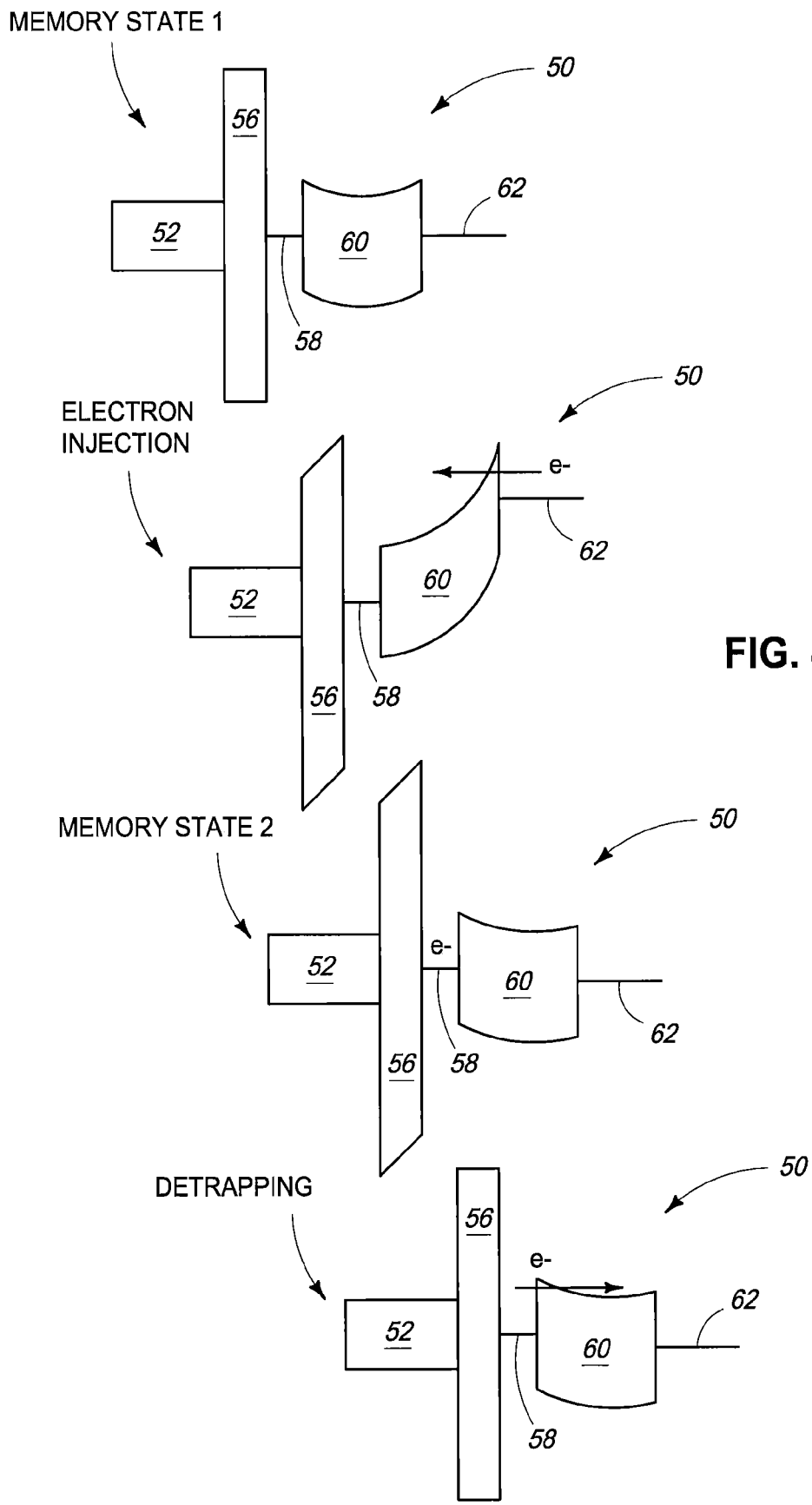

MEMORY CELLS AND METHODS OF STORING INFORMATION

TECHNICAL FIELD

Memory cells and methods of storing information.

BACKGROUND

Memory is one type of integrated circuitry, and is used in computer systems for storing data (i.e., information). Integrated memory is usually fabricated in one or more arrays of individual memory cells. The memory cells might be volatile, semi-volatile, or nonvolatile. Nonvolatile memory cells can store data for extended periods of time, and in some instances can store data in the absence of power. Volatile memory dissipates and is therefore refreshed/rewritten to maintain data storage.

The memory cells are configured to retain or store memory in at least two different selectable states. In a binary system, the states are considered as either a "0" or a "1". In other systems, at least some individual memory cells may be configured to store more than two levels or states of information.

There is a continuing goal to develop improved memory. For instance, the components utilized in memory cells may degrade over time, which can lead to decreased performance characteristics of memory cells, and eventually to failure of the memory cells. Accordingly, it is desired to develop memory cells having improved stability. As another example, it is desired to reduce the amount of real estate consumed by individual memory cells in order to increase the amount of memory that may be retained on an individual chip.

It would be desired to develop improved memory, and improved methods for utilizing memory to store information.

BRIEF DESCRIPTION OF THE DRAWINGS

FIG. 4 diagrammatically illustrates various operational modes of the FIG. 3 memory cell.

DETAILED DESCRIPTION OF THE ILLUSTRATED EMBODIMENTS

Some embodiments include new memory cells which utilize gallium indium zinc oxide as a charge-trapping material. The gallium indium zinc oxide which may be referred to as IGZO or GIZO. The ordering of the letters G, I, Z and O does not imply the relative amounts of the atomic constituents represented by such letters; and thus the terms IGZO and GIZO are entirely synonymous with one another.

The IGZO utilized in the embodiments described herein may comprise any suitable stoichiometry. For instance, IGZO may be considered to comprise a ratio of $Ga_2O_3:In_2O_3:ZnO$ in some embodiments; and such ratio may be any suitable ratio, including, for example, 1:1:1, 2:2:1, 3:2:1, 4:2:1, etc.

Figure 1:
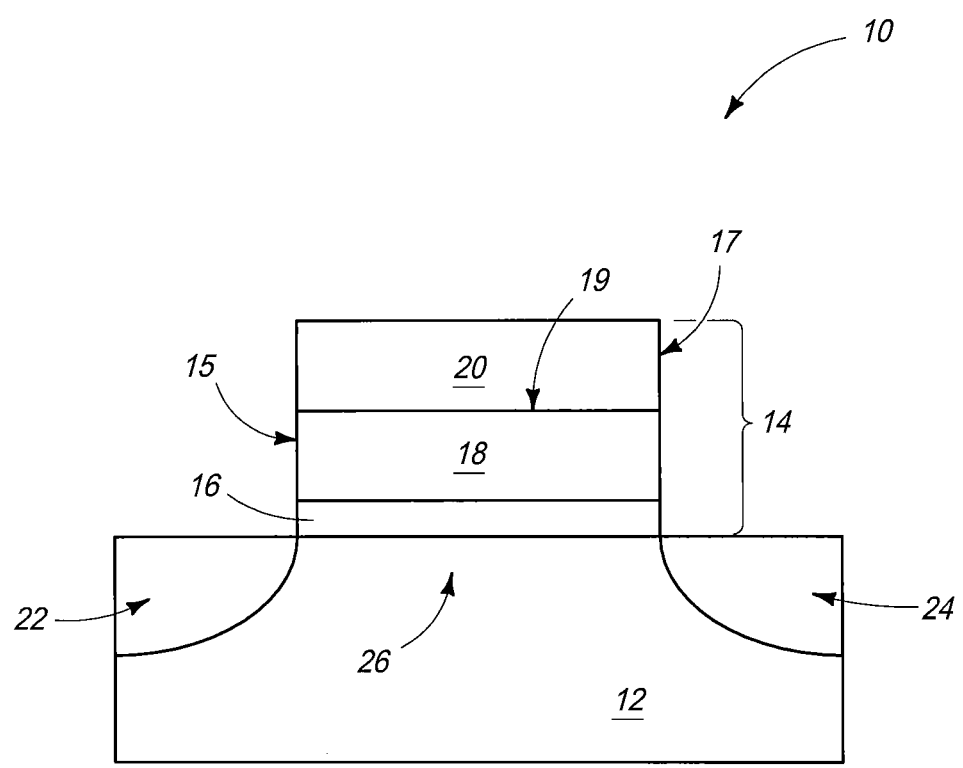
FIG. 1 is a diagrammatic cross-sectional view of an example embodiment memory cell.

An example memory cell 10 is shown in FIG. 1. Such memory cell comprises a channel-supporting material 12, and a stack 14 over the channel-supporting material. The stack 14 includes a dielectric material 16, a carrier-trapping material 18, and an electrically conductive electrode material 20. In the shown embodiment, the dielectric material 16 is over and directly against the channel-supporting material 12; the carrier-trapping material 18 is over and directly against the dielectric material 16; and the electrically conductive electrode material 20 is over and directly against the carrier-trapping material. The shown relative thicknesses of the various materials 16, 18 and 20 illustrates one of many embodiments, and the actual relative thicknesses may be any suitable thicknesses.

The memory cell also comprises a pair of source/drain regions 22 and 24 extending into the channel-supporting material.

The channel-supporting material 12 may comprise any suitable composition or combination of compositions; and in some embodiments may comprise, consist essentially of, or consist of one or more of graphene, IGZO, and any of various semiconductor materials (for instance, silicon, germanium, etc.). If the channel-supporting material 12 comprises a semiconductor material, such semiconductor material may be p-type background doped in some embodiments.

The channel-supporting material may be part of a semiconductor base (for instance, a monocrystalline silicon base) in some embodiments, or may be supported by a semiconductor base. For instance, the channel-supporting material may comprise, consist essentially of, or consist of graphene and/or IGZO, and may be supported over a monocrystalline silicon base in some embodiments.

The dielectric material 16 may comprise any suitable composition or combination of compositions; and in some embodiments may comprise, consist essentially of, or consist of one or more of silicon dioxide, silicon nitride, hafnium oxide, zirconium oxide, etc.

The carrier-trapping material 18 comprises IGZO, and accordingly may comprise, consist essentially of, or consist of a combination which includes gallium, indium, zinc and oxygen. In some embodiments, the carrier-trapping material may behave as an n-type material. In some embodiments, the carrier-trapping material may be doped with one or more suitable dopants, including, for example, hydrogen.

The electrically conductive electrode material 20 may comprise any suitable composition or combination of compositions; and in some embodiments may comprise, consist essentially of, or consist of elemental metal (for instance, silver, gold, etc.), metal mixtures (for instance, alloys, etc.), metal-containing compounds (for instance, metal silicide, metal nitride, etc.), and/or conductively-doped semiconductor materials (for instance, conductively-doped silicon, conductively-doped germanium, etc.).

The interface between the carrier-trapping material 18 and the electrically conductive material 20 may be a diode junction 19. In some embodiments, the electrode material 20 comprises metal, and the interface between the carrier-trapping material 18 and the electrode material 20 is a Schottky-type diode junction.

The channel-supporting material 12 can support a channel 26 formed beneath dielectric material 16 and between the source/drain regions 22 and 24. The source/drain regions 22 and 24 may be any suitable electrically conductive regions. In some embodiments, the source/drain regions may correspond to conductively-doped regions formed within a semiconductor material 12. In other embodiments, material 12 may comprise graphene, IGZO, or non-semiconductor material; and the source/drain regions may correspond to electrically conductive material (for instance, metal-containing material) formed within openings that extend into such material 12.

The illustrated stack 14 comprises vertical sidewalls 15 and 17 that extend from an upper surface of channel-supporting material 12 to an upper surface of electrode material 20. In other embodiments, one or more of the materials 16, 18 and 20 may be patterned differently from the other materials. For instance, the dielectric material 16 may be patterned differently from materials 18 and 20 so that material 16 extends outwardly to over the source/drain regions 22 and 24, while materials 18 and 20 remain patterned as shown. Accordingly, the vertical sidewalls 15 and 17 may be only along the materials 18 and 20 in some embodiments, rather than extending along all of the materials 16, 18 and 20.

The illustrated memory cell may be one of a plurality of memory cells that are simultaneously fabricated across a semiconductor die as part of an integrated circuit memory array.

An advantage of incorporating IGZO into a memory cell is that IGZO may be fabricated with relatively low temperature processing (for instance, IGZO may be formed at temperatures of less than or equal to about 150° C.). Such low-temperature processing may be easier to incorporate into an integrated fabrication sequence than higher temperature processing, in that the low-temperature processing is less likely to damage integrated circuit components. In some embodiments, this may provide methodology suitable for utilization in the fabrication of three-dimensional stacked structures.

The IGZO of the charge-trapping material 18 may be utilized as a wide bandgap semiconductor material having a low minority carrier concentration. The memory cell 10 may be considered to have two different memory states, with one of the memory states having a relatively high amount of charge stored in the charge-trapping material 18, and the other of the memory states having a relatively low amount of charge stored in such charge-trapping material.

Figure 2:
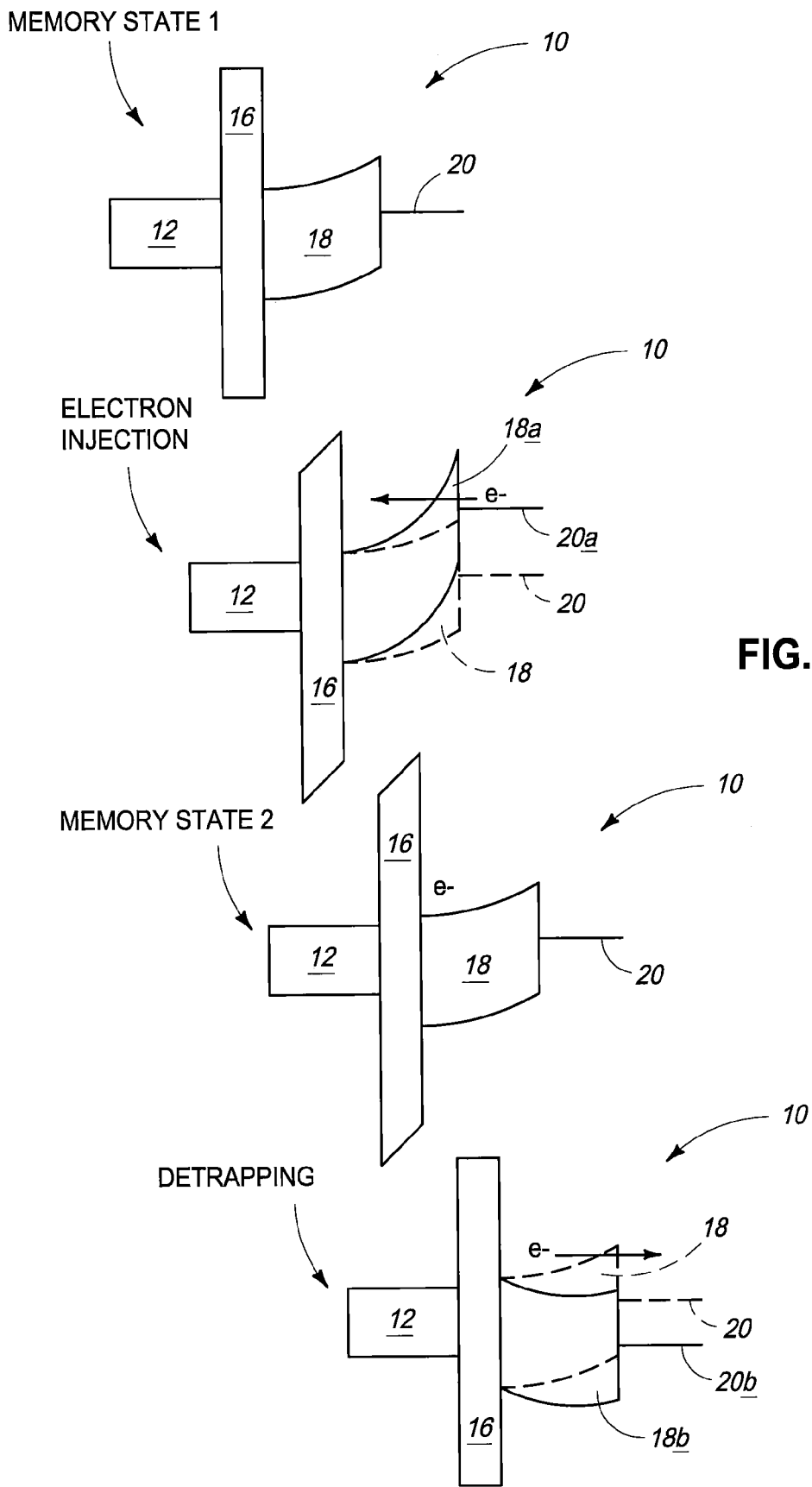
FIG. 2 diagrammatically illustrates various operational modes of the FIG. 1 memory cell.

FIG. 2 shows example modes of operation of the memory cell 10, with such modes being illustrated in terms of bandgap diagrams.

An initial state is shown at the top of FIG. 2 as "Memory State 1". The memory state has relatively little charge stored on carrier-trapping material 18 as compared to another memory state shown as "Memory State 2" and described below.

The next state shown in FIG. 2 is an "Electron Injection" state in which an energy level of electrode material 20 is raised so that electrons (illustrated as e-) are injected from material 20 onto charge-trapping material 18. The initial energy states of materials 18 and 20 are shown in dashed-line in FIG. 2, and the raised energy states of such materials are shown in solid lines at levels 18a and 20a, respectively. In some embodiments, the energy level of electrode material 20 may be raised by providing an electric field across the diode junction 19 (FIG. 1) such that the electrode material 20 has a negative potential relative to the channel-supporting material 12.

The next state shown in FIG. 2 is "Memory State 2," and is a state in which the energy level of electrode material 20 has been relaxed back to the initial level, but in which charge (illustrated as an electron, e-) is stored by the charge-trapping material 18. Accordingly, the second memory state (Memory State 2) has a higher amount of charge stored by the charge-trapping material 18 than does the first memory state (Memory State 1). The energy barrier of the potential well trapping the electrons onto charge-trapping material 18 of Memory State 2 may be about 0.5 electron volts (eV).

The final state shown in FIG. 2 is a "Detrapping" state in which an energy level of electrode material 20 is lowered so that electrons (illustrated as e-) transfer out of the memory cell; and specifically are detrapped from the charge-trapping material 18. The initial energy states of materials 18 and 20 are shown in dashed-line in FIG. 2, and the lowered energy states of such materials are shown in solid lines at levels 18b and 20b, respectively. In some embodiments, the energy level of electrode material 20 may be lowered by providing an electric field across the diode junction 19 (FIG. 1) such that the electrode material 20 has a positive potential relative to the channel-supporting material 12.

In some embodiments, the electric field utilized during the "Electron Injection" state may be a first electric field which reverse biases the diode junction 19 (FIG. 1), and the electric field utilized during the "Detrapping" state may be a second electric field which forward biases such diode junction. In some embodiments, the electrode material 20 may have a negative potential relative to the channel-supporting material 12 for the first electric field, and may have a positive potential relative to such channel-supporting material for the second electric field. In other embodiments the relative orientations of the first and second electric fields may be reversed. The relative orientations of the first and second electric fields may depend on the nature of the carriers (electrons or holes) which are utilized during operation of the memory cell.

In operation, "Memory State 1" may be distinguished from "Memory State 2" by ascertaining the current between source/drain regions 22 and 24 (i.e., the current across channel region 20) under controlled conditions (the regions 22, 24 and 20 are shown in FIG. 1). Thus, information may be stored and accessed on memory cell 10 by placing the memory cell in one of the memory states shown as "Memory State 1" and "Memory State 2", and then later ascertaining the memory state of the cell.

The memory cell 10 may be programmed and de-programmed rapidly, and thus may be well-suited for utilization in dynamic random access memory (DRAM) applications. Further, the memory states of the cell may be stable enough so that the cells may be utilized with little or no refresh. For instance, the memory states of the cells may have lifetimes of seconds, minutes, or even years, in the absence of refresh. Even though the cells may be stable for long periods in the absence of refresh, refresh may be utilized in some applications to enhance integrity of information storage. Although the memory cell 10 may be well-suited for DRAM applications, such memory cell may also be utilized in many other applications.

Figure 3:
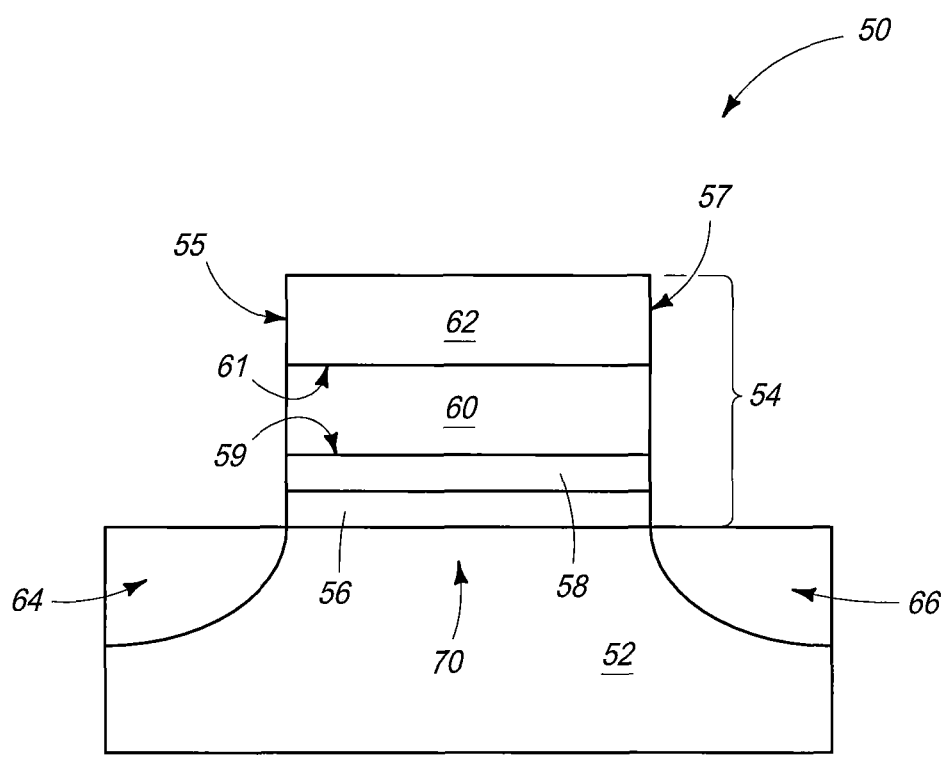
FIG. 3 is a diagrammatic cross-sectional view of another example embodiment memory cell.

The memory cell of FIG. 1 has the charge-trapping material 18 directly against dielectric material 16. In other embodiments, electrically conductive material may be provided between the charge-trapping material and the dielectric material. An example embodiment memory cell having conductive material between the charge-trapping material and the dielectric material is shown in FIG. 3 as a memory cell 50.

Memory cell 50 comprises a channel-supporting material 52, and a stack 54 over the channel-supporting material. The stack 54 includes a dielectric material 56, a first electrically conductive material 58, a carrier-trapping material 60, and a second electrically conductive material 62. In the shown embodiment, the dielectric material 56 is over and directly against the channel-supporting material 52; the first electrically conductive material 58 is over and directly against the dielectric material 56; the carrier-trapping material 60 is over and directly against the first electrically conductive material 58, and the second electrically conductive material 62 is over and directly against the carrier-trapping material. The shown relative thicknesses of the various materials 56, 58, 60 and 62 illustrates one of many embodiments, and the actual relative thicknesses may be any suitable thicknesses.

The memory cell also comprises a pair of source/drain regions 64 and 66 extending into the channel-supporting material.

The channel-supporting material 52 may comprise any suitable composition or combination of compositions, including the various compositions discussed above relative to the channel-supporting material 12 of FIG. 1. Accordingly, in some embodiments the channel-supporting material 52 may comprise, consist essentially of, or consist of one or more of graphene, IGZO, and any of various semiconductor materials (for instance, silicon, germanium, etc.).

The channel-supporting material 52 may be part of a semiconductor base (for instance, a monocrystalline silicon base) in some embodiments, or may be supported by a semiconductor base. For instance, the channel-supporting material may comprise, consist essentially of, or consist of graphene and/or IGZO, and may be supported over a monocrystalline silicon base in some embodiments.

The dielectric material 56 may comprise any suitable composition or combination of compositions, including the various compositions discussed above relative to the dielectric material 16 of FIG. 1. Accordingly, in some embodiments the dielectric material 56 may comprise, consist essentially of, or consist of one or both of silicon dioxide and silicon nitride.

The first electrically conductive material 58 may comprise any suitable composition or combination of compositions; and in some embodiments may comprise, consist essentially of, or consist of elemental metal (for instance, silver, gold, etc.), metal mixtures (for instance, alloys, etc.), metal-containing compounds (for instance, metal silicide, metal nitride, etc.), and/or conductively-doped semiconductor materials (for instance, conductively-doped silicon, conductively-doped germanium, etc.). In some embodiments, material 58 may comprise, consist essentially of, or consist of one or more of Pt, Rh, Ru and ruthenium oxide.

The carrier-trapping material 60 comprises IGZO, and accordingly may comprise, consist essentially of, or consist of a combination which includes gallium, indium, zinc and oxygen. In some embodiments, the carrier-trapping material may behave as an n-type material. In some embodiments, the carrier-trapping material may be doped with one or more suitable dopants, including, for example, hydrogen.

The second electrically conductive material 62 may comprise any suitable composition or combination of compositions, including the various compositions discussed above relative to the electrode material 20 of FIG. 1. Accordingly, in some embodiments the second electrically conductive material 62 may comprise, consist essentially of, or consist of elemental metal (for instance, silver, gold, etc.), metal mixtures (for instance, alloys, etc.), metal-containing compounds (for instance, metal silicide, metal nitride, etc.), and/or conductively-doped semiconductor materials (for instance, conductively-doped silicon, conductively-doped germanium, etc.). In some embodiments, the electrically conductive materials 58 and 62 may be the same composition as one another (for instance, both may comprise, consist essentially of, or consist of silver or gold), and in other embodiments such electrically conductive materials may be different compositions relative to one another.

The interface between the carrier-trapping material 60 and the first electrically conductive material 58 may be a first diode junction 59, and the interface between the carrier-trapping material 60 and the second electrically conductive material 62 may be a second diode junction 61. In some embodiments, the conductive materials 58 and 62 comprise metal, and the diode junctions 59 and 61 are Schottky-type diode junctions.

The channel-supporting material 52 can support a channel 70 formed beneath dielectric material 56 and between the source/drain regions 64 and 66. The source/drain regions 64 and 66 may be any suitable electrically conductive regions. In some embodiments, the source/drain regions may correspond to conductively-doped regions formed within a semiconductor material 52. In other embodiments, material 52 may comprise graphene, IGZO, or non-semiconductor material; and the source/drain regions may correspond to electrically conductive material (for instance, metal-containing material) formed within openings that extend into such material 52.

The illustrated stack 54 comprises vertical sidewalls 55 and 57 that extend from an upper surface of channel-supporting material 52 to an upper surface of the second electrically conductive material 62. In other embodiments, one or more of the materials 56, 58, 60 and 62 may be patterned differently from the other materials. For instance, the dielectric material 56 may be patterned differently from materials 58, 60 and 62 so that material 56 extends outwardly to over the source/drain regions 64 and 66, while materials 58, 60 and 62 remain patterned as shown. Accordingly, the vertical sidewalls 55 and 57 may be only along the materials 58, 60 and 62 in some embodiments, rather than extending along all of the materials 56, 58, 60 and 62.

The illustrated memory cell may be one of a plurality of memory cells that are simultaneously fabricated across a semiconductor die as part of an integrated circuit memory array.

FIG. 4 shows example modes of operation of the memory cell 50, with such modes being illustrated in terms of bandgap diagrams.

An initial state is shown at the top of FIG. 4 as "Memory State 1". The memory state has relatively little charge stored in an energy well within electrically conductive material 58 as compared to another memory state shown as "Memory State 2" and described below.

The next state shown in FIG. 4 is an "Electron Injection" state in which an energy level of electrically conductive material 62 is raised so that electrons (illustrated as e-) are injected from material 62, across the charge-trapping material 60 and into the energy well within the electrically conductive material 58. In some embodiments, the energy level of material 62 may be raised by providing an electric field across the memory cell 50 such that the material 62 has a negative potential relative to the channel-supporting material 52.

The next state shown in FIG. 4 is "Memory State 2," and is a state in which the energy level of electrically conductive material 62 has been relaxed back to the initial level, but in which charge (illustrated as electrons, e-) is stored in the energy well within electrically conductive material 58. Accordingly, the second memory state (Memory State 2) has a higher amount of charge stored within the energy well than does the first memory state (Memory State 1). The energy barrier of the potential well trapping the electrons within material 58 may be about 0.95 eV on the GIZO side of material 58 (i.e., the side adjacent to material 60), and may be within a range of from about 2 eV to about 3 eV on the dielectric side of material 58 (i.e., the side adjacent to material 56).

The final state shown in FIG. 4 is a "Detrapping" state in which an energy level of electrically conductive material 62 is lowered so that electrons (illustrated as e-) transfer out of the memory cell; and specifically are detrapped from the energy well within the electrically conductive material 58. In some embodiments, the energy level of electrically conductive material 62 may be lowered by providing an electric field across the memory cell 50 such that the electrically conductive material 62 has a positive potential relative to the channel-supporting material 52.

In operation, "Memory State 1" may be distinguished from "Memory State 2" by ascertaining the current between source/drain regions 64 and 66 (i.e., the current across channel region 70) under controlled conditions (the regions 64, 66 and 70 are shown in FIG. 3). Thus, information may be stored on memory cell 50 by placing the memory cell in one of the memory states shown as "Memory State 1" and "Memory State 2", and then later accessed by ascertaining the memory state of the cell.

The memory cell 50 may store information for long periods without refresh (i.e., may be nonvolatile), and thus may be well-suited for utilization in NAND applications. The memory cell may also be utilized in many other applications.

In some embodiments, the memory cells described herein may be considered to correspond to memory cells analogous to conventional DRAM (which has a transistor and a capacitor). However, unlike conventional DRAM, the memory cells of some embodiments described herein utilize a transistor (or a structure analogous to a transistor), and no capacitor; and thus may be considered to be 1T0C (i.e., one transistor, zero capacitor) devices.

The memory cells described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory cell comprising a channel-supporting material, a dielectric material over the channel-supporting material, a carrier-trapping material over the dielectric material, and an electrically conductive electrode material over and directly against the carrier-trapping material; where the carrier-trapping material comprises gallium, indium, zinc and oxygen.

Some embodiments include a memory cell comprising a channel-supporting material, a dielectric material over the channel-supporting material, a first metal-containing material over and directly against the dielectric material, a carrier-trapping material over and directly against the first metal-containing material, and a second metal-containing material over and directly against the carrier-trapping material; where the carrier-trapping material comprises gallium, indium, zinc and oxygen.

Some embodiments include a method of storing information. A memory cell is provided to comprise a channel-supporting material, a dielectric material over the channel-supporting material, a carrier-trapping material over the dielectric material, and an electrically conductive electrode material over and directly against the carrier-trapping material; wherein the carrier-trapping material comprises gallium, indium, zinc and oxygen. It is determined if carriers are trapped in the carrier-trapping material to thereby ascertain a memory state of the memory cell.

Some embodiments include a method of storing information. A memory cell is provided to comprise a channel-supporting material, a dielectric material over the channel-supporting material, a carrier-trapping material over the dielectric material, and an electrically conductive electrode material over and directly against the carrier-trapping material; wherein the carrier-trapping material comprises gallium, indium, zinc and oxygen; and wherein the carrier-trapping material and electrically conductive electrode material together forming a diode junction. A first electric field is provided across the memory cell, with the first electric field reverse biasing the diode junction to inject carriers into the carrier-trapping material and thereby place the memory cell in a first memory state. A second electric field is provided across the memory cell, with the second electric field forward biasing the diode junction and detrapping the carriers from the carrier-trapping material to thereby place the memory cell in a second memory state.

Some embodiments include a method of storing information. A memory cell is provided to comprise a channel-supporting material, a dielectric material over the channel-supporting material, a first metal-containing material over the dielectric material, a carrier-trapping material over and directly against the first metal-containing material, and a second metal-containing material over and directly against the carrier-trapping material; wherein the carrier-trapping material comprises gallium, indium, zinc and oxygen. It is determined if carriers are trapped in the first metal-containing material to thereby ascertain a memory state of the memory cell.

Some embodiments include a method of storing information. A memory cell is provided to comprise a channel-supporting material, a dielectric material over the channel-supporting material, a first metal-containing material over the dielectric material, a carrier-trapping material over and directly against the first metal-containing material, and a second metal-containing material over and directly against the carrier-trapping material; wherein the carrier-trapping material comprises gallium, indium, zinc and oxygen. A first electric field is provided across the memory cell, with the first electric field causing carriers to be injected into the first metal-containing material and thereby placing the memory cell in a first memory state. A second electric field is provided across the memory cell, with the second electric field causing the carriers to be detrapped from the first metal-containing material and thereby placing the memory cell in a second memory state.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
   a channel-supporting material;
   a dielectric material over the channel-supporting material;
   a carrier-trapping material over the dielectric material; the carrier-trapping material comprising gallium, indium, zinc and oxygen; and
   an electrically conductive electrode material over and directly against the carrier-trapping material.

2. The memory cell of claim 1 wherein the electrically conductive electrode material comprises metal.

3. The memory cell of claim 1 wherein the carrier-trapping material is directly against the dielectric material.

4. The memory cell of claim 1 wherein the electrically conductive electrode material is a second electrically conductive material, and further comprising a first electrically conductive material between the carrier-trapping material and the dielectric material.

5. The memory cell of claim 4 wherein the first electrically conductive material comprises metal.

6. The memory cell of claim 1 wherein the channel-supporting material comprises gallium, indium, zinc and oxygen.

7. The memory cell of claim 1 wherein the channel-supporting material comprises semiconductor material.

8. The memory cell of claim 1 wherein the channel-supporting material comprises graphene.

9. A memory cell, comprising:
   a channel-supporting material;
   a dielectric material over the channel-supporting material;
   a first metal-containing material over and directly against the dielectric material;
   a carrier-trapping material over and directly against the first metal-containing material; the carrier-trapping material comprising gallium, indium, zinc and oxygen; and
   a second metal-containing material over and directly against the carrier-trapping material.

10. The memory cell of claim 9 wherein the first metal-containing material, carrier-trapping material and second metal-containing material together form a stack having substantially vertical sidewalls that extend from an upper surface of the dielectric material to an upper surface of the second metal-containing material.

11. The memory cell of claim 9 wherein the dielectric material comprises one or more of silicon dioxide, silicon nitride, hafnium oxide and zirconium oxide.

12. The memory cell of claim 9 wherein the carrier-trapping material is doped with hydrogen.

13. The memory cell of claim 9 wherein the channel-supporting material comprises gallium, indium, zinc and oxygen.

14. A method of storing information, comprising:
    providing a memory cell to comprise a channel-supporting material, a dielectric material over the channel-supporting material, a carrier-trapping material over the dielectric material, and an electrically conductive electrode material over and directly against the carrier-trapping material; wherein the carrier-trapping material comprises gallium, indium, zinc and oxygen; and
    determining if carriers are trapped in the carrier-trapping material to thereby ascertain a memory state of the memory cell.

15. A method of storing information, comprising:
    providing a memory cell to comprise a channel-supporting material, a dielectric material over the channel-supporting material, a carrier-trapping material over the dielectric material, and an electrically conductive electrode material over and directly against the carrier-trapping material; wherein the carrier-trapping material comprises gallium, indium, zinc and oxygen; the carrier-trapping material and electrically conductive electrode material together forming a diode junction;
    providing a first electric field across the memory cell, the first electric field reverse biasing the diode junction to inject carriers into the carrier-trapping material and thereby placing the memory cell in a first memory state; and
    providing a second electric field across the memory cell, the second electric field forward biasing the diode junction and detrapping the carriers from the carrier-trapping material to thereby place the memory cell in a second memory state.

16. The method of claim 15 wherein the electrically conductive electrode is negatively charged under the first electric field.

17. A method of storing information, comprising:
    providing a memory cell to comprise a channel-supporting material, a dielectric material over the channel-supporting material, a first metal-containing material over the dielectric material, a carrier-trapping material over and directly against the first metal-containing material, and a second metal-containing material over and directly against the carrier-trapping material; wherein the carrier-trapping material comprises gallium, indium, zinc and oxygen; and
    determining if carriers are trapped in the first metal-containing material to thereby ascertain a memory state of the memory cell.

18. A method of storing information, comprising:
    providing a memory cell to comprise a channel-supporting material, a dielectric material over the channel-supporting material, a first metal-containing material over the dielectric material, a carrier-trapping material over and directly against the first metal-containing material, and a second metal-containing material over and directly against the carrier-trapping material; wherein the carrier-trapping material comprises gallium, indium, zinc and oxygen;
    providing a first electric field across the memory cell, the first electric field causing carriers to be injected into the first metal-containing material and thereby placing the memory cell in a first memory state; and
    providing a second electric field across the memory cell, the second electric field causing the carriers to be detrapped from the first metal-containing material and thereby placing the memory cell in a second memory state.

19. The method of claim 18 wherein the second metal-containing material is negatively charged under the first electric field.

20. The method of claim 18 wherein the carrier-trapping material is doped with hydrogen.

* * * * *